United States Patent [19]

Kim et al.

[11] Patent Number: 5,678,011
[45] Date of Patent: Oct. 14, 1997

[54] EASILY-UPGRADABLE COMPUTER AND CPU BOARD THEREFOR

[75] Inventors: Taewook Kim; Seungkee Sihn; Nohbyung Park, all of Kyungki-do, Rep. of Korea

[73] Assignee: Samsung Electronics Co., Ltd., Suwon, Rep. of Korea

[21] Appl. No.: 417,349

[22] Filed: Apr. 5, 1995

[30] Foreign Application Priority Data

Apr. 20, 1994 [KR] Rep. of Korea .................. 94-8296

[51] Int. Cl.⁶ .................................. G06F 1/16
[52] U.S. Cl. .................. 395/282; 395/800; 395/500; 395/309; 361/760; 361/748
[58] Field of Search ............... 395/500, 800, 395/311, 309, 280, 281, 282; 361/737, 748, 760, 777, 728; 439/74, 75

[56] References Cited

U.S. PATENT DOCUMENTS

| | | | |
|---|---|---|---|
| 4,929,185 | 5/1990 | Wong et al. | 439/74 |
| 4,942,550 | 7/1990 | Murray | 395/282 |
| 5,185,881 | 2/1993 | Brooks et al. | 395/182.01 |
| 5,321,827 | 6/1994 | Lu et al. | 395/500 |
| 5,384,692 | 1/1995 | Jaff | 361/807 |
| 5,410,726 | 4/1995 | Baqai | 395/800 |
| 5,455,927 | 10/1995 | Huang | 395/800 |
| 5,473,766 | 12/1995 | Shaver | 395/500 |
| 5,490,279 | 2/1996 | Golbert et al. | 395/800 |
| 5,506,981 | 4/1996 | Madter | 395/550 |
| 5,546,563 | 8/1996 | Chuang | 395/500 |
| 5,551,012 | 8/1996 | Chuang et al. | 395/500 |

*Primary Examiner*—Larry D. Donaghue
*Attorney, Agent, or Firm*—Cushman Darby & Cushman, IP Group Of Pillsbury Madison & Sutro LLP

[57] ABSTRACT

An easily-upgradable computer includes a CPU board removably attached to a main board. The CPU board includes a CPU, a jump setting circuit which includes a plurality of factory-set jump switches, and a pair of first connectors electrically connected to the CPU and jump setting circuit. The main board includes a plurality of conventional peripheral devices, drivers and controllers, a clock generator, and a pair of second connectors removably coupled and electrically connected to the pair of first connectors. A wiring pattern of the CPU board electrically connects address, data, control signal, and power supply terminals of the CPU to the pair of first connectors, and a wiring pattern of the main board electrically connects the plurality of peripheral devices, drivers, and controllers, and the clock generator to the pair of second connectors. The jump switches on the CPU board are factory-set in accordance with the operational specifications of the CPU, and control the clock generator on the main board.

18 Claims, 4 Drawing Sheets

EASILY-UPGRADABLE COMPUTER AND CPU BOARD THEREFOR

FIELD OF THE INVENTION

The present invention relates generally to the field of upgradable computers, and, more particularly, to a computer, e.g., a personal computer (PC), such as a desktop, notebook, laptop, or pen computer, which can be easily upgraded by merely replacing a removable microprocessor or central processing unit (CPU) card or board rather than its entire main board. The present invention also relates to the CPU board which facilitates such upgradability of the PC.

BACKGROUND OF THE INVENTION

Rapid improvements in microprocessor design and manufacturing technology have spawned the rapid introduction of successive new generations of faster and more powerful microprocessors. Consequently, computer purchasers are faced with increasingly shorter time periods between their date of purchase until the introduction of the next new generation of microprocessors, thereby necessitating their purchase of a new computer which incorporates the current generation microprocessor if they are to realize the benefits afforded thereby. One alternative currently available to such computer owners is to replace the entire main board of their computer with a new main board incorporating the desired microprocessor or CPU, which is burdensome and not very cost-effective. The reason for this is the fact that the microprocessor or CPU is fixedly mounted on the main board.

With reference now to FIG. 3, there can be seen a block diagram of a conventional main board 2 which includes a CPU 11, a display driver 231, a disk drive controller 232, a power supply 233, a read only memory device (ROM) 234, a random access memory device (RAM) 235, a keyboard controller 236, a chipset 237, a power management system 238, an extension port controller 239, and a clock generator 22 interconnected by a system bus. The CPU 11 is fixedly mounted on the main board 2. The only way to upgrade the CPU of a computer using this conventional type of main board is to change the entire main board 2.

In order to overcome the limitation of the above-described conventional computer technology, a main board having a fixedly mounted CPU plus a socket for receiving an upgraded CPU has been developed. A computer utilizing this type of main board is upgradable without changing the entire main board by plugging an upgraded CPU into the socket. However, in order to effect an upgrade using such a main board, it is necessary for the computer owner to reconfigure a plurality of jump switches provided on the main board for the purpose of adjusting clock signals generated on the board for synchronizing the operation of the upgraded CPU plugged into the socket and the peripheral devices provided on the main board. This is a time-consuming and complex task which is very difficult for a layperson (i.e., the typical computer owner) to perform, and thus, this task is generally delegated to an outside computer service firm.

Thus, upgrading the CPU of this type of upgradable computer is burdensome/inconvenient and not very cost-effective. Moreover, since the original CPU is fixedly mounted on the main board, it is rendered useless, i.e., it can not be re-used in another computer, and further, occupies valuable real estate on the main board, thereby imposing another constraint on the minimum achievable size of the main board, which is a particular drawback in the realm of transportable computers, such as notebook and laptop computers.

Based on the above and foregoing, it can be appreciated that there presently exists a need in the art for an easily upgradable computer which overcomes the above-described disadvantages and shortcomings of the presently available computers. The present invention fulfills this need.

SUMMARY OF THE INVENTION

The present invention encompasses a novel CPU board which facilitates easy upgrade of a computer, and a computer including the novel CPU board removably attached to a novel main board.

The CPU board includes a printed circuit board (PCB) having a wiring pattern, a CPU mounted on a first major surface of the PCB, connection facilities for removably coupling and electrically connecting the CPU to a main board of a computer, and a jump setting circuit including a plurality of preferably factory-set jump switches, wherein the jump setting circuit and data, address, control signal, and power supply terminals of the CPU are electrically connected to the connection facilities by the wiring pattern.

In another of its aspects, the present invention encompasses an easily-upgradable computer which includes a CPU board removably attached to a main board. The CPU board includes a CPU, a jump setting circuit which includes a plurality of factory-set jump switches, and a pair of first connectors electrically connected to the CPU and jump setting circuit. The main board includes a plurality of conventional peripheral devices, drivers and controllers, a clock generator, and a pair of second connectors removably coupled and electrically connected to the pair of first connectors. A wiring pattern of the CPU board electrically connects address, data, control signal, and power supply terminals of the CPU to the pair of first connectors, and a wiring pattern of the main board electrically connects the plurality of peripheral devices, drivers, and controllers, and the clock generator to the pair of second connectors. The jump switches on the CPU board are factory-set in accordance with the operational specifications of the CPU, and control the clock generator on the main board.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 4:
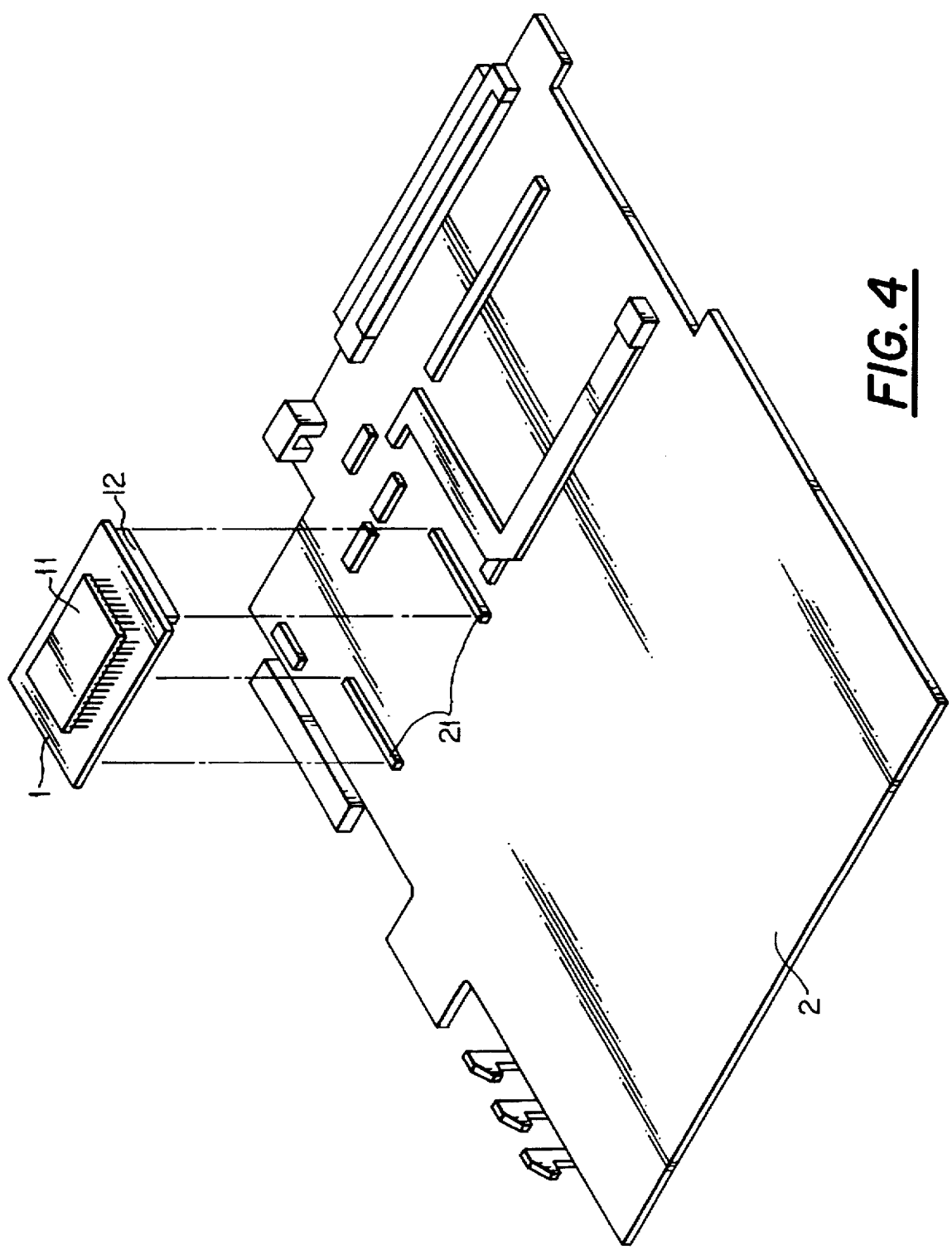
FIG. 4 is a perspective view depicting the relationship between the CPU board of the present invention and the main board of the present invention.

With reference now to FIG. 4, there can be seen a perspective view depicting the relationship of a CPU board 1 and a main board 2 of the present invention. Generally, the CPU board 1 is designed to plug into or otherwise be removably connected to the main board 2, e.g., by means of male connectors 12 provided on the underside of the CPU board 1 being inserted or plugged into female or plug-in receptacles 21 provided on the main board 2. However, the gender of the connectors 12 and 21 can be reversed, or may be of any other suitable construction for effecting an electrical interconnection between the CPU board 1 and the main board 2. A major advantage of the present invention over presently available computer technology is that the CPU board 1 is self-contained, in the sense that all of the necessary jump switches are factory-set and all of the necessary interconnections between the CPU and the various peripheral devices, drivers and controllers which reside on the main board 2 are hard-wire into the CPU board 1, i.e., the CPU board 1 is a printed circuit board having an appropriate wiring pattern.

Figure 1A:
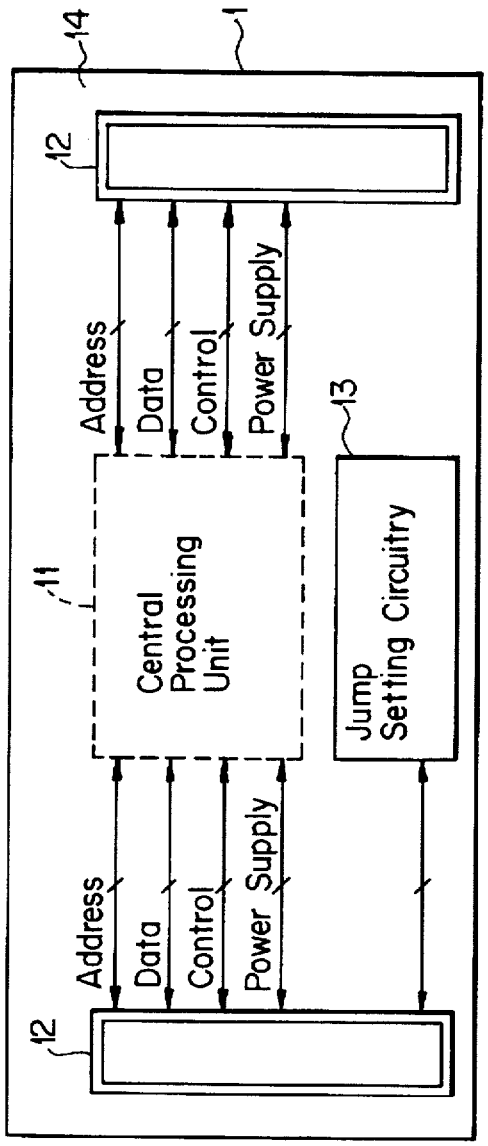
FIG. 1A is a block diagram of a plug-in, removable CPU board for upgrading a computer, constructed in accordance with a preferred embodiment of the present invention.

With reference now to FIG. 1A, there can be seen a block diagram of a preferred embodiment of the CPU board 1 of the present invention. The CPU board 1 includes a CPU 11 mounted on the front or upper surface of a printed circuit board 14. In a preferred embodiment of the present invention, the CPU 11 is fixedly mounted, e.g., soldered to, the upper/top surface of the printed circuit board 14. The CPU board 1 further includes the CPU board connectors 12 provided on opposite sides of the underside or bottom surface of the printed circuit board 14. The CPU board 1 also includes jump setting circuitry 13 which includes a plurality of jump switches, such as the jump switches JP1-JP5 shown in FIG. 2, which is a circuit diagram of a preferred embodiment of the jump setting circuitry 13. Of course, the number of jump switches provided is not a limiting feature of the present invention. Address, data, control, and power supply terminals of the CPU 11, and an output terminal of each of the jump switches JP1-JP5 are electrically connected to at least one of the CPU board connectors 12 by the patterned wiring layer provided on the printed circuit board 14, as represented by the lines having double-headed arrows in FIG. 1A.

Figure 1B:
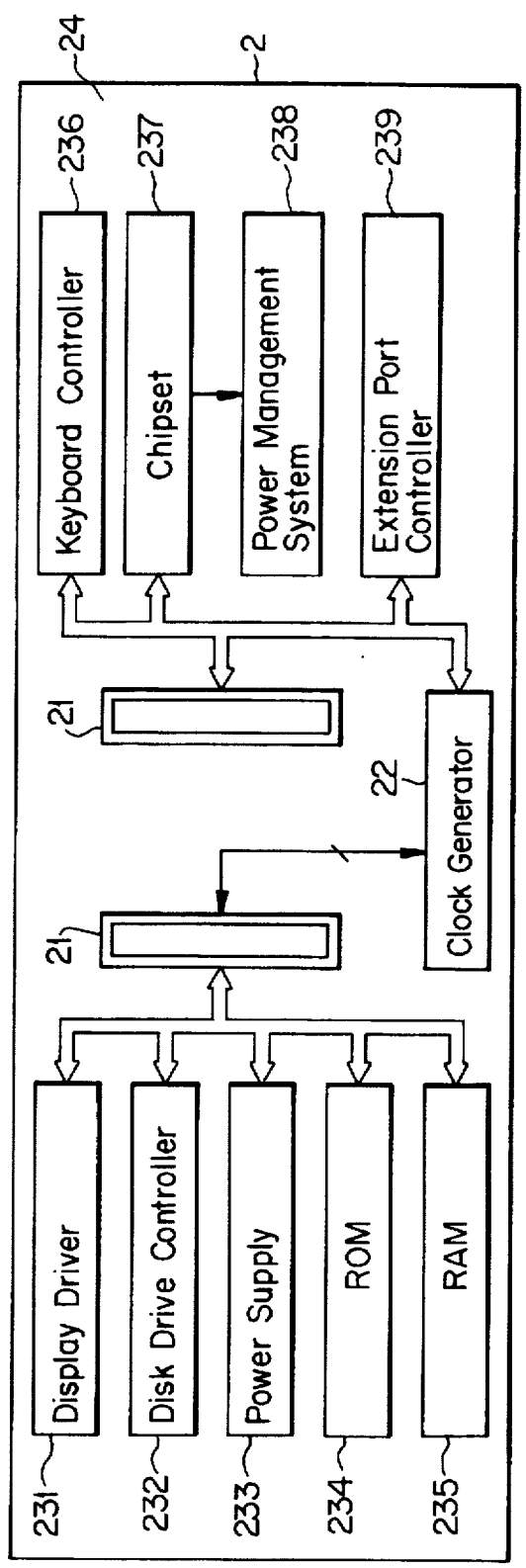
FIG. 1B is a block diagram of a main board of an easily upgradable computer constructed in accordance with a preferred embodiment of the present invention.

With reference now to FIG. 1B, there can be seen a block diagram of a preferred embodiment of the main board 2 of the present invention. The main board 2 includes the main board connectors 21 provided on the front or top surface of a printed circuit board 24, with the spacing between the main board connectors 21 being the same as the spacing between the CPU board connectors 12, to thereby facilitate interconnection therewith. The main board 2 further includes a display driver 231, a disk drive controller 232, a power supply 233, a ROM 234, a RAM 235, a keyboard controller 236, a chipset 237, a power management system 238, a clock generator 22, and an extension port controller 239 interconnected in any suitable configuration by a printed wiring pattern provided on the printed circuit board 24, as represented by the line having a double-headed arrow between the clock generator 22 and the connector 21, and the system bus lines having double-headed arrows, in FIG. 1B.

The CPU board 1 of the present invention facilitates easy upgradability of a computer utilizing a main board like the main board 2 of the present invention, without the need for the computer owner to replace the entire main board, and without the need to set each of a plurality of jump switches. Of course, the present invention encompasses the CPU board 1 itself, the main board 2 itself, and a computer including the combination of the CPU board 1 and the main board 2.

Although the details of construction and operation of the present invention will be readily apparent to a person of ordinary skill in the computer arts, they are nonetheless briefly summarized below, for the convenience of the reader, it being understood that this particular implementation of the present invention is not limiting thereto.

Figure 2:
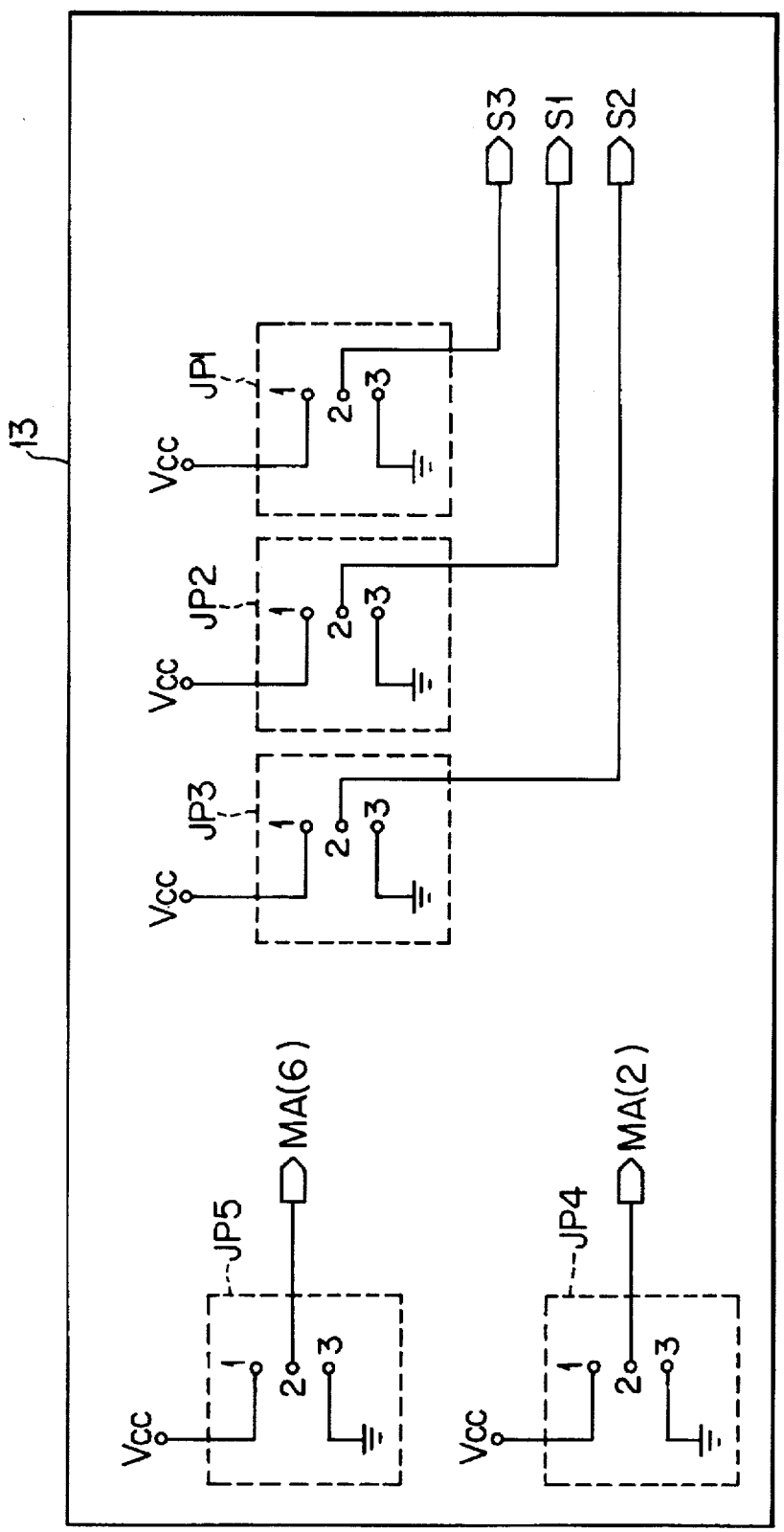
FIG. 2 is a circuit diagram of the jump setting means of the CPU board depicted in FIG. 1A.
Figure 3:
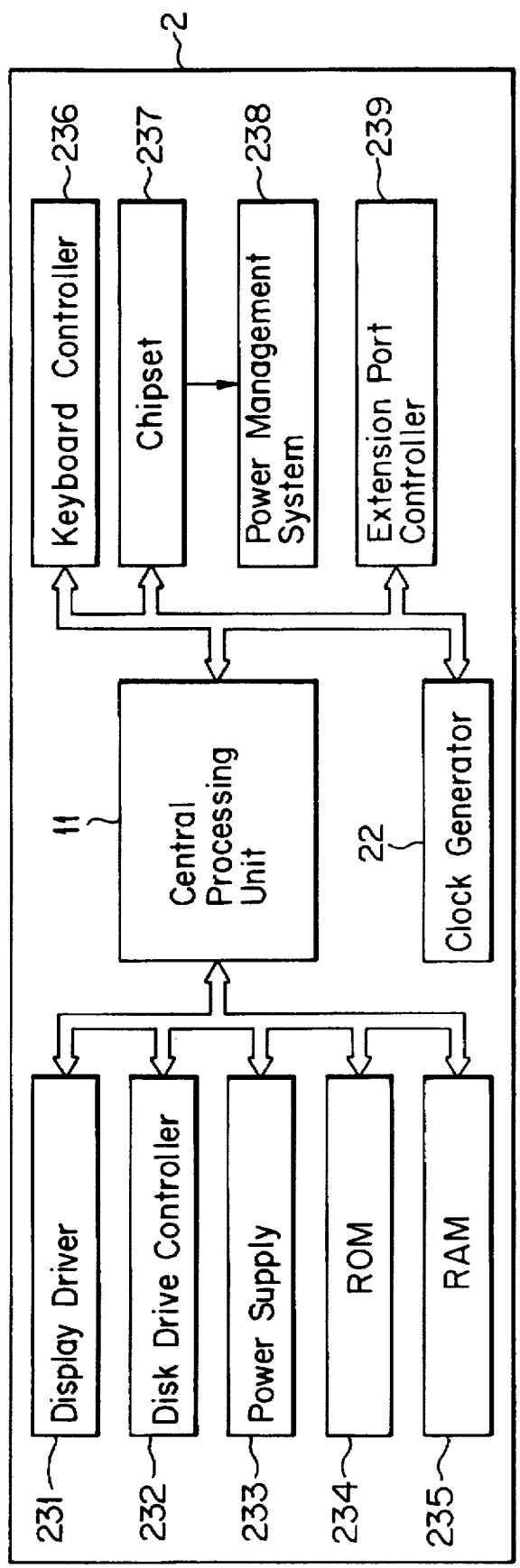
FIG. 3 is a block diagram of a main board of a conventional computer.

With reference to FIG. 2, the switches JP1-JP5 are factory-set in accordance with the following table, for the various different types of CPUs 11 set forth at the top of respective columns of the table.

|     | SX-1X | SX-2X | DX-1X | DX-2X | DX/2 | DX/4 |
| --- | --- | --- | --- | --- | --- | --- |
| JP1 | 1-2 | 1-2 | 1-2 | 1-2 | 2-3 | 2-3 |
| JP2 | 2-3 | 2-3 | 2-3 | 2-3 | 1-2 | 1-2 |
| JP3 | 2-3 | 2-3 | 2-3 | 2-3 | 1-2 | 1-2 |
| JP4 | 1-2 | 2-3 | 1-2 | 2-3 | 1-2 | 1-2 |
| JP5 | 1-2 | 1-2 | 1-2 | 1-2 | 2-3 | 2-3 |

In the above table, 1-2 signifies that terminals 1 and 2 of the respective jump switch are connected to each other, and 2-3 signifies that the terminals 2 and 3 of the respective jump switch are connected to each other. The jump switches JP1-JP3 determine the switching conditions of the clock signals (not shown) of the CPU 11, the jump switch JP4 selects either the X1 or X2 clock (not shown) of the CPU 11, and the jump switch JP5 selects the 33 Mhz or 25 Mhz clock (not shown) of the CPU 11.

With reference to FIG. 1B, the various peripheral devices, drivers, and controllers 231-239, and the clock generator 22 provided on the main board 2, can be of any type well-known in the art, and function in the manner briefly summarized hereinafter.

In general, the display driver 231 generally includes a video card (not shown) which supplies a video signal to a display device (not shown), to which the computer incorporating the main board 2 is connected or which is integral thereto. Exemplary display devices include liquid crystal displays (LCDs) and cathode ray tube displays (CRTs).

In general, the disk drive controller 232 provides the I/O interface between the CPU 11 and a hard disk drive (not shown) and/or a floppy disk drive (not shown) and/or an optical disk drive, such as a CD-ROM drive (not shown), and/or any other suitable data storage peripheral device. The ROM 234 stores the operational data and programs necessary to operate the overall computer system, including, for example, the keyboard scan code program, the system operation program, and the BIOS program. The RAM 235 stores data as required during the execution of a program by the CPU 11.

In general, the keyboard controller 236 generates scan code data corresponding to the keys on the computer keyboard (not shown) depressed by a user, and supplies this scan code data to the CPU 11.

In general, the power management system 238 determines the current power mode (e.g., active, sleep, quiet, etc.) of the overall computer system, including the CPU board 1, the main board 2, and all peripheral devices (e.g., hard disk drive, display device, keyboard, mouse, etc.) connected thereto. The chipset 237 carries out the commands of the power management system 238 and also performs other operations to maintain the proper overall operation of the system.

In general, the extension port controller 239 provides the necessary interfaces between the CPU 11 and various computer performance-enhancing printed circuit cards (not shown) which can be optionally plugged into respective extension ports (not shown). Exemplary cards include a sound card, a communication (e.g., modem).card, a multimedia card, a graphics card, a pen computer digitizer card, etc.

Although preferred features and embodiments of the present invention have been described in detail hereinabove, it should be clearly understood that many variations and/or modifications thereof which may appear to those skilled in the art will still fall within the spirit and scope of the present invention as defined in the appended claims.

What is claimed is:

1. A central processing unit (CPU) board for a computer having a main board not containing a CPU, said CPU board comprising:

a printed circuit board having a wiring pattern;

a CPU mounted on a first major surface of said printed circuit board, said CPU having a plurality of terminals and being operative in accordance with an externally generated clock signal received through certain of said terminals;

means for removably coupling and electrically connecting said CPU board to said main board of said computer; and a jump setting circuit including a plurality of jump switches, each of said jump switches being set in predetermined accordance with an operational specification of said CPU so as to control a clock controller on said main board to produce said clock signal suitable for said CPU, wherein said jump setting circuit and said terminals of said CPU are electrically connected to said connecting means by said wiring pattern, said CPU thereby receiving said clock signal produced by said clock controller on said main board via said connecting means.

2. The CPU board as set forth in claim 1, wherein said terminals of said CPU include address, data, control signal, and power supply terminals.

3. The CPU board as set forth in claim 1, wherein said removably coupling and electrically connecting means comprises a first and a second connector provided on a second major surface of said printed circuit board adjacent opposite first and second sides of said CPU, wherein said second major surface is opposite said first major surface.

4. The CPU board as set forth in claim 3, wherein said terminals of said CPU include a first set of address, data, control signal, and power supply terminals provided on said first side of said CPU, and a second set of address, data, control signal, and power supply terminals provided on said second side of said CPU.

5. The CPU board as set forth in claim 4, wherein said terminals of said first set are coupled to said first connector, said terminals of said second set are coupled to said second connector, and said jump switches of said jump setting circuit are coupled to said first connector.

6. The CPU board as set forth in claim 3, wherein each of said jump switches is factory-set in accordance with operational specifications of said CPU.

7. The CPU board as set forth in claim 6, wherein said first and second connectors are male connectors.

8. The CPU board as set forth in claim 3, wherein said first major surface is a top surface of said printed circuit board, and said second major surface is a bottom surface of said printed circuit board.

9. The CPU board as set forth in claim 1, wherein said jump setting circuit further includes a second plurality of jump switches which are set in further predetermined accordance with said operational specification of said CPU so as to control a power supply on said main board to supply a power suitable for said CPU.

10. An easily-upgradable computer, comprising:

a CPU board, including:
a wiring pattern,
a first connecting means,
a CPU mounted on a first major surface of said CPU board, said CPU having a plurality of terminals and being operative in accordance with an externally generated clock signal received through certain of said terminals, and
a jump setting circuit including a plurality of jump switches, each of said jump switches being set in predetermined accordance with an operational specification of said CPU so as to control a clock controller external to said CPU board to produce said clock signal suitable for said CPU, said jump setting circuit and said terminals of said CPU being electrically connected to said first connecting means by said wiring pattern;

a main board that does not contain a CPU, including:
a second connecting means for mating with said first connecting means, said first connecting means and said second connecting means being configured to removably couple and electrically connect said CPU board and said main board; and, said clock controller that communicates with said jump setting circuit and said terminals of said CPU through said first and second connecting means when they are mated together and produces said clock signal in accordance with said jump switches.

11. The computer as set forth in claim 10, wherein said terminals of said CPU include address, data, control signal, and power supply terminals.

12. The computer as set forth in claim 10, wherein said first connecting means comprises first and second connectors provided on a second major surface of said CPU board adjacent opposite first and second sides of said CPU, wherein said second major surface is opposite said first major surface.

13. The computer as set forth in claim 12, wherein said first and second connectors are male connectors spaced apart from each other by a first interval.

14. The computer as set forth in claim 13, wherein said second connecting means comprises third and fourth connectors provided on a major surface of said main board, said third and fourth connectors being spaced apart from each other by a second interval equal to said first interval.

15. The computer as set forth in claim 14, wherein said third and fourth connectors are female receptacles adapted to receive and mate with said first and second connectors, respectively.

16. The computer as set forth in claim 15, wherein said first major surface is a top surface of said CPU board, and said second major surface is a bottom surface of said CPU board.

17. The computer as set forth in claim 10, wherein said main board further comprises a power supply, a ROM, a RAM, a disk drive controller, a display driver, a keyboard controller, and said clock controller electrically connected to said second connecting means.

18. The computer as set forth in claim 17, wherein said CPU is fixedly mounted to said CPU board, and said terminals of said CPU include address, data, control signal, and power supply terminals.

* * * * *